United States Patent [19]

Harrison et al.

[11] Patent Number: 4,488,038
[45] Date of Patent: Dec. 11, 1984

[54] PHOTOTRANSISTOR FOR LONG WAVELENGTH RADIATION

[75] Inventors: Thomas R. Harrison, Fair Haven; Ping K. Tien, Chatham Township, Morris County, both of N.J.

[73] Assignee: AT&T Bell Laboratories, Murray Hill, N.J.

[21] Appl. No.: 367,177

[22] Filed: Apr. 12, 1982

[51] Int. Cl.³ .............................................. H01J 40/14
[52] U.S. Cl. ................................... 250/211 J; 357/15
[58] Field of Search .............. 250/211 J, 578; 357/15, 357/29, 30

[56] References Cited

U.S. PATENT DOCUMENTS

| 4,242,695 | 12/1980 | Ouchi et al. | 357/30 |
| 4,358,782 | 11/1982 | Takasuka et al. | 357/15 |
| 4,398,344 | 8/1983 | Gould | 357/15 |

OTHER PUBLICATIONS

*IEEE Journal of Solid-State Circuits*, vol. SC-11, No. 1, Feb. 1976, "A Charge-Coupled Infrared Imaging Array with Schottky-Barrier Detectors," E. S. Kohn, pp. 139–146.

*International Electron Devices Meeting Technical Digest*, Washington, D.C., Dec. 8–10, 1980, "Recent Experimental Results on Permeable Base Transistors," G. D. Alley, C. O. Bozler, D. C. Flanders, R. A. Murphy and W. T. Lindley, pp. 608–612.

*Applied Phys. Letters*, vol. 40(2), Jan. 15, 1982, "Surface Structure of Epitaxial $Pd_2Si$ Thin Films," pp. 138–140, K. Oura, S. Okada, Y. Kishikawa, and T. Hanawa.

*Primary Examiner*—David C. Nelms
*Attorney, Agent, or Firm*—Arthur J. Torsiglieri

[57] ABSTRACT

A photodetector useful at long wavelengths where silicon normally is transparent. It includes a photodiode stage which comprises a silicide layer forming a Schottky-barrier junction with a silicon substrate and which is integrated with an amplification stage which uses a silicon transistor adapted to amplify the photovoltaic voltage derived by the photodiode stage. In the preferred embodiment, the silicide layer forms the grid of a permeable base transistor.

8 Claims, 4 Drawing Figures

PHOTOTRANSISTOR FOR LONG WAVELENGTH RADIATION

TECHNICAL FIELD

This invention relates to photodetectors, particularly for use at relatively long wavelengths.

BACKGROUND OF THE INVENTION

With the discovery of the availability of optical fibers which exhibit extremely low attenuation to long wavelength light, e.g., the range of approximately 1.0 microns to 1.7 microns, there has developed a need for fast photodetectors for use at such wavelengths.

In particular, it was previously known that imaging, sensitive at these wavelengths, could be provided utilizing silicide Schottky-barrier detectors fabricated on silicon wafers. See, for example, the article by E. S. Kohn, entitled "A Charge-Coupled Infrared Imaging Array with Schottky-Barrier Detectors" appearing in the *IEEE Journal of Solid-State Circuits*, Vol. SC-11, No. 1, February 1976, pp. 139-146. These detectors comprise a palladium silicide layer on a p-type silicon crystal to form a Schottky-barrier diode. When such a diode is biased in reverse and infrared light is made incident on the semiconductor for passage therethrough and absorption in the metal, it can act as a photodetector. Carriers formed in the silicide by the absorption of the infrared are photoexcited over the barrier from the silicide into the silicon where they become majority carriers and form a photocurrent.

It was recognized that the quantum efficiency of this process is low but this shortcoming was compensated for by the relative independence of the sensitivity to such parameters as semiconductor doping and minority carrier lifetime.

Moreover, the response extends to photon energies as low as the barrier height, a value that can be considerably smaller than the bandgap in silicon, permitting operation at wavelengths much longer than with the ordinary silicon photodetector and, accordingly, in a range of interest.

Our interest in photodetection is primarily for use in optical transmission systems where the optical pulses transmitted need to be detected and converted to electrical signals either for use in repeaters for the regeneration of the optical pulses for further transmission or for utilization at the signal's final destination. In such applications it is usually necessary to amplify the electrical signal after detection.

Moreover because of the low level of the detection signals in such silicide Schottky-barrier detectors, it is important for transmission applications that the amplification be done without adding significant noise. In accordance with a feature of our invention, amplification is achieved by integrating a photodiode stage monolithically with an amplifier stage to achieve a high signal-to-noise ratio at the output of the integrated circuit. In our preferred embodiment the diode stage and the amplifier stage are merged in a device to be called a permeable base phototransistor.

In a typical embodiment of the invention, the photodiode comprises a silicide layer on a silicon crystal substrate and the amplifier is a silicon transistor which utilizes, as the control element to which the input is applied, an electrode which is effectively an electrical extension of the silicide layer of the photodetector. Moreover the transistor also utilizes as the controlled conduction channel, which controls the output branch, a silicon body which is also part of the silicon crystal of the photodiode.

In a preferred embodiment the amplifier is a permeable grid silicon transistor in which the permeable grid is a silicide layer which is epitaxial both with underlying and overlying silicon layers, between which the carrier flow is controlled by the silicide grid. This grid is adapted to absorb the optical signal to be detected and to develop from it a photovoltaic signal which is amplified. In this structure, the photodiode stage is effectively merged with the amplifier stage. The dopings in the silicon layers are designed to encourage avalanche multiplication of the photocarriers generated.

In one aspect the invention is a permeable base phototransistor.

Other embodiments are described utilizing MOS and Schottky-barrier field-effect transistors.

DETAILED DESCRIPTION

Figure 1:
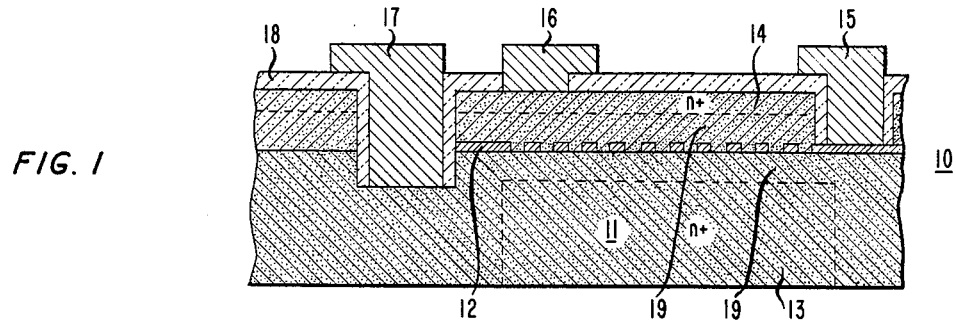
FIGS. 1 and 2 show in cross section permeable base phototransistor embodiments of the invention.

With reference now to the drawing, the permeable base phototransistor 10 shown in FIG. 1 comprises a monocrystalline silicon body 11 which provides the main structural support for the phototransistor. It typically would be 20 mils thick and its bulk portion would be lightly n-type.

Within the crystal is the permeable grid formed by the permeable portion of a silicide layer 12, typically $Pd_2Si$, $NiSi_2$, or $PtSi$, which divides a portion of the silicon body into a collector portion 13 and an emitter portion 14. A metal electrode 15, typically of aluminum, serves as an electrical contact to a solid portion of the layer 12. Metal electrodes 16 and 17, also typically of aluminum, serve as electrical contacts to the emitter portion 14 and collector portions 13 of the silicon body. A layer 18 of a suitable dielectric, typically silicon dioxide, is used to isolate electrically the various electrodes. In this embodiment, advantageously, electrodes 15, 16 and 17 are all on a common surface opposite to the surface which is adapted to be irradiated with the incident light to be detected.

As shown, the light is made incident on the silicon body to pass through for absorption in the silicide layer, particularly in the region where the permeable grid separates the body into the emitter and collector portions. Advantageously, to concentrate the applied electric field to the region of the body in the region of the grid to promote avalanche multiplication of the carriers photogenerated there, the body has been diffused or implanted with donor ions at the surface regions of the emitter and collector portions enclosed by the broken line, leaving lightly doped the intermediate portion 19 surrounding the permeable grid.

In operation, provision would be made to maintain the permeable base contact 15 at a negative potential with respect to the emitter contact 16 whereby a reverse bias is developed at the Schottky-barrier junction which the silicide layer 12 makes with the silicon body. Similarly, the collector contact 17 is maintained at a positive potential with respect to the emitter contact 16 to develop therebetween a current flow which will be modulated by the photovoltaic voltage developed on the permeable base as a result of the absorption of light by the silicide layer. This modulated current will develop a signal across a load connected between the emitter and collector electrodes.

The general principles of permeable base transistors are known and are discussed, for example, in a paper entitled "Recent Experimental Results on Permeable Base Transistors" by G. D. Alley, C. O. Bozler, D. C. Flanders, R. A. Murphy, and W. T. Lindley, published in the *International Electron Devices Meeting Technical Digest*, Washington, D.C., Dec. 8–10, 1980, pp. 608–612. As is described in the paper, for efficient operation it is important that the permeable grid not introduce significant defects in the crystal structure of the semiconductive body.

Accordingly, in the embodiment described the silicide layer advantageously is introduced into the silicon body without disturbing significantly the crystal structure of the silicon body. For minimal disturbance of the crystal structure of the silicon body, it is usually advantageous to form the silicide layer as an epitaxial growth on a silicon crystal substrate, followed in turn by an epitaxial growth of a silicon layer over the silicide layer. Techniques for growing palladium silicide ($Pd_2Si$) epitaxially on a silicon crystal are described in detail in a paper entitled "Surface Structure of Epitaxial $Pd_2Si$ Thin Films" by K. Oura, S. Okada, Y. Kishikawa, and T. Hanawa, published in *Applied Phys. Letters*, Vol. 40(2), 15, January 1982, pp. 138–140. Moreover, reference is made to a paper for growing nickel silicide ($NiSi_2$) and platinum silicide (PtSi) on silicon substrates by H. Ishiwara, published in the *Proceedings of the Symposium on Thin Film Interfaces and Interactions*, edited by J. E. E. Baglin and J. M. Poate (Electrochemical Society, N.Y. 1980), p. 159. Typically these techniques involve use of molecular beam epitaxy.

For the fabrication of the device shown, there typically would be prepared a monocrystalline silicon substrate of relatively high purity, and molecular beam epitaxy in a stoichiometric codeposition would be used to form the desired silicide layer directly on the heated silicon substrate. After growth of a layer of desired thickness, typically between 500 to 1000 Angstroms thick, fine line or X-ray photolithography would be used to pattern the layer in the desired grid pattern. Typically, a series of stripes about 1000 Angstroms wide with about 1000 Angstroms spacing would be formed in a portion of the layer to serve as the permeable grid, each stripe remaining attached at its two ends to the continuous portion of the layer for providing electrical connection to the individual stripe. Then after cleaning to remove any debris, and appropriate annealing to improve the crystal structure of the silicide, molecular beam epitaxy would be used to grow a relatively high purity silicon layer epitaxially over the silicide to complete the silicon body structure shown. Conventional techniques would be used to form the electrode contacts and to create the more heavily doped emitter and collector portions of the silicon body. Typically, the initial silicon substrate would be n-type with an excess donor concentration of about $1 \times 10^{15}$ ions/cm$^3$ and the surface regions of the emitter and collector regions would be implanted to have excess donor concentration of at least $1 \times 10^{18}$ ions/cm$^3$. It is usually preferable to have a higher doping in the emitter region in order to lower series resistance. A low collector doping reduces collector base capacitance desirably for better high frequency response.

Figure 2:
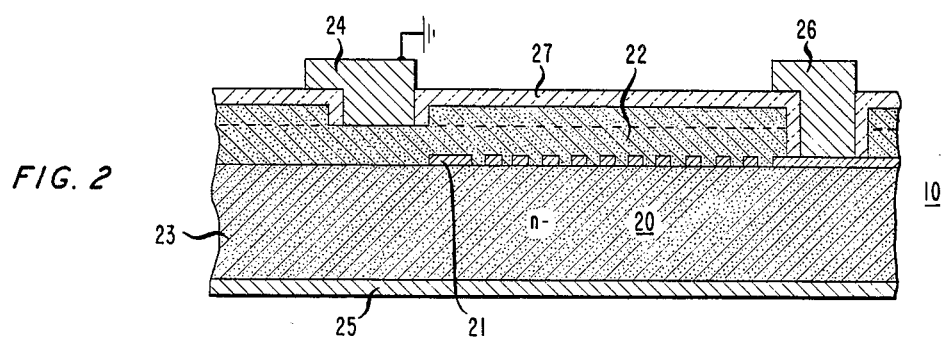

In FIG. 2, there is shown an embodiment which is designed for applications where avalanche multiplication is not desired. Additionally, this embodiment is designed for the light being detected to be incident on the emitter surface rather than the collector surface. It comprises a silicon crystal 20 whose bulk is lightly-doped n-type and which includes a silicide layer 21 which includes a permeable grid portion which divides the crystal into an emitter portion 22 and a collector portion 23. An electrode 24 makes electrical connection to the emitter portion, an electrode 25 makes electrical connection to the collector portion, and an electrode 26 makes electrical connection to the silicide layer. An oxide layer 27 covers exposed portions of the crystal. Only the surface region of the emitter region is implanted to increase locally its donor doping to decrease the series resistance.

Operation of this embodiment would be similar to that of the FIG. 1 embodiment. However, because operation is not to be dependent on avalanche multiplication, the electric field in the region of the grid can be less and so the d-c bias voltage maintained between the emitter and collector contacts can be lower.

Figure 3:
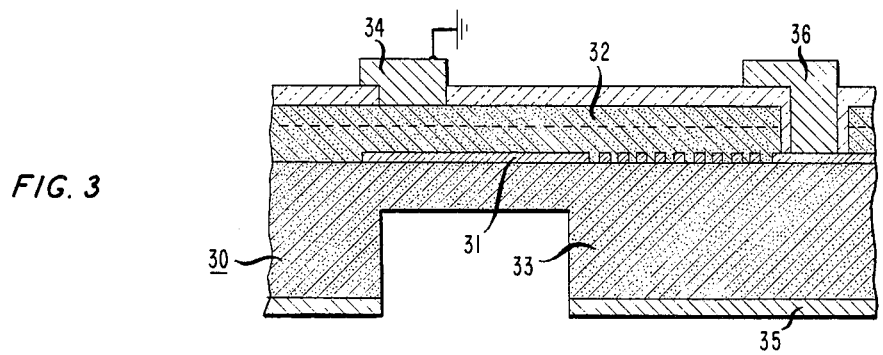
FIG. 3 shows in cross section an embodiment in which a separate photodiode stage is integrated with a separate permable base transistor stage.

In FIG. 3, there is shown an embodiment in which the photogeneration of carriers occurs in a region of the crystal 30 distinct from that where transistor action or amplification occurs. To this end, the crystal includes on the left side, as seen in the drawing, a separate photodiode detector and on the right side a separate permeable base transistor. The photodiode comprises essentially the continuous portion of the silicide layer 31 embedded in the silicon crystal. The silicide layer also includes a grid portion which divides the crystal into an emitter portion 32 and a collector portion 33. The emitter portion is provided with an electrode 34 and the collector portion with electrode 35. The silicide layer is provided with an electrode 36 which is maintained at a negative bias. Essentially, the photodiode stage comprises the continuous silicide layer portion and the overlying silicon which is an extension of the emitter portion of the silicon crystal and the photovoltaic voltage developed in the photodiode stage between the emitter and the silicide layer by the incident light is impressed between the emitter and permeable base of the transistor stage where it serves to modulate the current flow through a load connected between the emitter and collector electrodes.

As shown in this embodiment, it is desirable to remove some of the silicon material underlying the continuous silicide layer portion to provide an opening for input light waves through the aluminum collector contact 35.

Figure 4:
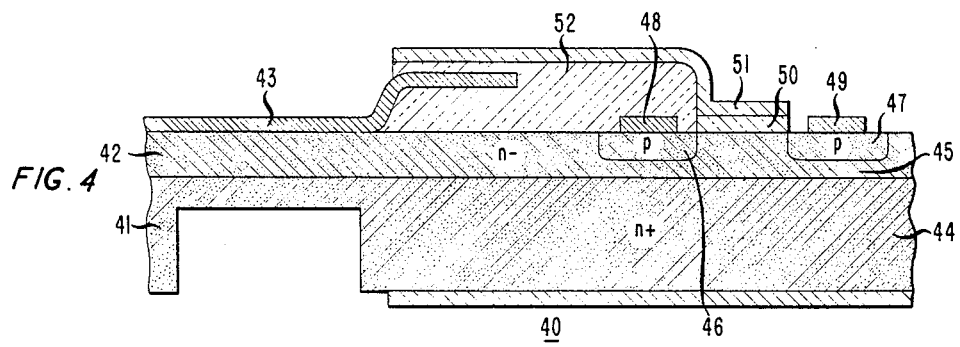
FIG. 4 shows in cross section an embodiment in which a separate photodiode stage is integrated with a separate MOS field-effect transistor stage.

In the embodiment shown in FIG. 4, the photodiode is integrated with an MOS transistor in which the photovoltaic voltage developed on the silicide layer is used as the gate voltage to control the conductivity of a channel in the insulated gate field-effect transistor.

To this end, the silicon crystal 40 includes on the left a photodiode section and on the right a field-effect transistor section.

The photodiode section includes an n-type portion of the silicon crystal on whose top surface is provided a silicide layer forming a Schottky-barrier junction there-with. To this end, as seen in FIG. 4, the silicon crystal advantageously comprises on the left side a heavily doped n-type substrate portion 41 over which lies an epitaxial lightly doped n-type layer 42 over which lies the silicide layer 43.

The field-effect transistor portion on the right side includes a heavily doped n-type substrate portion 44 over which lies an epitaxial layer 45. These essentially are extensions of the substrate portion 41 and epitaxial layer 42 of the photodiode section. In the epitaxial layer 45 are spaced a p-type source 46 and a p-type drain 47. Source and drain electrodes 48 and 49 are provided to these regions. The intermediate lightly doped n-type region in which will be formed the channel is provided with a gate insulator layer 50, typically about 500 Angstroms thick of thermally grown silicon oxide. Over this gate insulator extends the gate electrode 51. These form a typical p-type channel enhancement mode transistor.

The gate electrode 51 is extended over a thick insulating layer to couple to an extension of the silicide layer 43 of the photodiode so that the photovoltaic signal voltages developed on the silicide layer are transmitted to the gate electrode. While in some instances, this can be direct coupling in which case the gate electrode may be a continuous extension of the silicide layer, in most instances it will be preferable to bias the gate electrode to a d-c voltage different from that to which the silicide electrode of the photodiode is to be biased, in which case the coupling between the gate electrode and the silicide layer is a-c or capacitive as shown in FIG. 4.

In operation, typically the n-type silicon bulk would be maintained at ground, the silicide layer would be maintained at a negative potential with respect to the silicon bulk to bias the Schottky-barrier junction of the photodiode in reverse, the source of the field-effect transistor would also be maintained at ground, and the drain would be maintained at a negative potential. Light of appropriate wavelength for absorption in the silicide incident on the photodiode would create a positive potential on the silicide layer which would be transmitted to the gate electrode to modulate the p-type inversion layer in the channel and permit current conduction between the source and drain regions and in an external load connected between the source and drain electrodes.

It should be evident at this point that a variety of field-effect transistors can be substituted for the transistor section in the embodiment shown in FIG. 4, and an electrode coupled to the silicide layer, either directly or capacitively, used as its control element whereby the relatively small photovoltaic signal derived by the photodiode stage is amplified. In particular, both enhancement and depletion mode transistors are feasible for this purpose, including forms in which the control element makes a Schottky-barrier connection to the silicon body for controlling conduction thereunder.

In addition although the invention has been described specifically with reference to use of a silicide as the material of the permeable base phototransistor, it should be evident that other conductive materials having the requisite properties should prove similarly useful. In particular, such a material should have the property that it can be incorporated into the semiconductive crystal without disturbing the crystal lattice so badly that transistor action is no longer feasible and that it forms a Schottky-barrier junction with the semiconductive crystal that is photovoltaic in response to incident radiation of the wavelength to be detected.

It should also be apparent that a variety of techniques should be available to increase the efficiency of the optical absorption in the photodiode including appropriate use of nonreflecting coatings and focusing arrangements.

What is claimed is:

1. A photodetector comprising photovoltaic means and amplification means in which the photovoltaic means comprises a silicide layer forming a Schottky-barrier photosensitive junction with a portion of a silicon crystal for developing a photovoltaic signal voltage when light is incident on the photosensitive junction and in which the amplification means comprises a portion of said silicon crystal, a control element, and means for applying biases for amplification and in which the photovoltaic signal voltage is applied to the control element for amplification.

2. A photodetector in accordance with claim 1 in which the photovoltaic means and the amplification means share a common portion of the silicon crystal.

3. A photodetector in accordance with claim 1 in which the portion of the silicon crystal of the photovoltaic means and the portion of the silicon crystal of the amplification means are different portions of the silicon crystal.

4. A photodetector in accordance with claim 1 in which the amplification means comprises a permeable base transistor and a portion of the silicide layer serves as the permeable base and control element of said transistor.

5. A photodetector in accordance with claim 1 in which the amplification means is a field-effect transistor and the photovoltaic signal voltage is applied to the gate electrode control element of the field-effect transistor.

6. A photodetector comprising a crystal whose bulk is silicon and which includes a silicide layer, a portion of which serves to divide the crystal into an emitter region and a collector region of a junction transistor with said portion of the layer serving as a permeable base of the transistor, the silicide layer being adapted to be irradiated with light for developing a photovoltaic voltage for controlling the flow of carriers in the crystal between the emitter and collector regions, and means for applying the biasing voltages to the transistor for amplification.

7. A photodetector in accordance with claim 6 further characterized in that the silicon crystal in the region of the silicide layer is adapted for avalanche multiplication of the photocarriers generated.

8. A permeable base phototransistor comprising a semiconductive crystal, a layer of a conductive material within the crystal forming a permeable base for dividing the crystal between an emitting and collecting region, the layer forming a Schottky-barrier photovoltaic contact to the crystal and adapted to be illuminated by radiation transparent to the crystal for developing a photovoltaic voltage on said permeable base for modulating the flow of carriers between the emitting and collecting regions, and means connected to the crystal for applying operating biases to the emitting and collecting regions and the permeable base and for deriving the modulated current.

* * * * *